United States Patent [19]
Fazlin

[11] 4,328,081
[45] May 4, 1982

[54] PLASMA DESMEARING APPARATUS AND METHOD

[75] Inventor: Fazal A. Fazlin, Saint Anthony Village, Minn.

[73] Assignee: Micro-Plate, Inc., Clearwater, Fla.

[21] Appl. No.: 204,329

[22] Filed: Nov. 4, 1980

Related U.S. Application Data

[63] Continuation of Ser. No. 124,468, Feb. 25, 1980, abandoned.

[51] Int. Cl.³ .......................... C23C 15/00; C23F 1/00
[52] U.S. Cl. .................. 204/192 E; 207/210; 156/345; 156/643
[58] Field of Search .................. 204/192 E, 298; 156/345, 643; 250/531; 134/1

[56] References Cited
U.S. PATENT DOCUMENTS

| | | | |
|---|---|---|---|
| 3,661,747 | 5/1972 | Byrnes, Jr. et al. | 204/192 |
| 4,123,663 | 10/1978 | Horiike | 250/531 |
| 4,148,705 | 4/1979 | Battey et al. | 204/192 E |
| 4,230,553 | 10/1980 | Bartlett et al. | 204/192 E |
| 4,264,393 | 4/1981 | Gorin et al. | 156/345 |
| 4,277,321 | 7/1981 | Bartlett et al. | 204/192 E |
| 4,282,077 | 8/1981 | Reavill | 204/192 E |
| 4,285,800 | 8/1981 | Welty | 204/298 |
| 4,287,851 | 9/1981 | Dozier | 118/723 |
| 4,289,598 | 9/1981 | Engle | 204/192 E |

Primary Examiner—Aaron Weisstuch
Attorney, Agent, or Firm—Jack E. Dominik

[57] ABSTRACT

The present invention is directed to employing a rectilinear chamber for desmearing in which the two transitional ends are frustopyramidal in configuration. Each frustopyramidal diffusion chamber has a controlled exhaust valve which is piped to the vacuum pump. Gas can be introduced to the diffusion chamber at a point adjacent the exhaust valve and centrally therefrom. Ideally there are an odd number of electrode pairs spaced vertically which generate a primary field, and the further spaced apart pairs generating a secondary field therebetween. Because the chamber is rectilinear, it can be proportioned to accommodate vertically spaced MPWB's in the secondary chamber portions. The method contemplates flowing plasma through a rectangular chamber by positioning the pairs of electrodes in closely spaced relationship to provide a primary field, one of the electrodes of each pair secured to a radio frequency source and the other to ground and then spacing the pairs a sufficient distance to permit the insertion of objects to be desmeared in the secondary field. The flow of plasma is directed to impact the objects and can be from left to right, then right to left thereby reversing the flow, pulsating or steady. In addition, in certain applications where plasma flow from one end to the other is not desired, the gas can be introduced centrally. The central introduction is also desirably employed for purging the rectilinear chamber.

28 Claims, 7 Drawing Figures

PLASMA DESMEARING APPARATUS AND METHOD

This is a continuation of application Ser. No. 124,468 filed Feb. 25, 1980, abandoned.

FIELD OF THE INVENTION

The present invention is directed to an apparatus and method for plasma desmearing. The same operates at exceedingly low pressures with a radio frequency induced activation of various gases which converts the same into plasma. One specific application is directed to the desmearing of holes in multi-layered printed circuit boards.

PRIOR ART

Plasma etching or desmearing is a technique utilizing active gases which are applied to organic surfaces such as epoxy, and more specifically in the hole of a printed wiring board, resulting in a chemical reaction which cleans the hole of unwanted debris. The reactant products are volatile, usually inert, and are pumped away through the vacuum system. A better appreciation of plasma technology as applied to state of the art printed wiring boards will be better understood with an explanation of smear, and the wet processes used to remove such smear.

Smear in a plated through-hole in a multi-layer wiring board is defined as the presence of an insulative or foreign material or combination of both over the conductive inner circuit, which, if not removed, causes poor electrical interconnect after the electrodeposition of copper in the hole of a multi-layer printed wiring board (hereinafter MPWB).

Smear forms primarily during the drilling operation. The possibilities of smear arise from improper lamination cycles (causing resin curing problems) and resulting in "soft spots" on the board. There can also be substandard resin characteristics leading to smear. Smear can also form if the drill is dull or has incorrect geometry. The speed, feed rate, and back-up material if incorrect can also cause smear. Smear can also occur if the hole size to pad dimension and distance between the holes is not properly designed. Technological advances in drilling and lamination have reduced the quantity of smear, but it is still virtually impossible to produce smear-free holes economically in production quantities.

The most commonly used procedure to remove smear by MPWB manufacturers is called the etchback process. This process begins with using either sulfuric acid or chromic acid and hydrofluoric acid or ammonium biflouride/hydrochloric acid. At times various combinations are used. After the acid treatment, the panels are rinsed in distilled or city water, neutralizing solution, and a final rinse. Thereafter they are either blown dry or heat dried. Modifications of these procedures for cleaning the holes depend on each manufacturer's requirements, but they are essentially a wet process.

Concentrated acids and their byproducts (corrosive fumes) are very undesirable since they pose serious health hazards and unsafe work environments. It is important to observe that the etchback process, while removing smear, can create its own set of problems. For example, after etchback, if the MPWB's are not properly rinsed and neutralized, they can leave salt deposits which can be transferred into the plating baths. This contaminates the board itself, the salts can be trapped inside, between the hole wall and the copper barrel, thus migrating laterally to yield poor insulation resistance and/or high resistance shorts. The shorts may not be detected visually and electrically at final inspection but can degrade the MPWB's in the field. This reduces product life and reliability. To resolve this condition, all MPWB's have to be thoroughly rinsed. If possible, rinsing takes place under pressure or agitation or a combination of both. The large amount of rinse water employed must be adequately treated prior to disposing of it as waste. The etchback process also leaves the hole wall ragged, and secondary treatment is required to condition the hole wall prior to the electrolytic deposition of copper or other materials.

The most significant drawback in the wet process is the lack of control. This is due to the fact that the rate of etchback is a function of solution concentrations, temperature, time and other factors. When there is no steady-state system available to maintain the proper chemical concentrations, it becomes a time-based function. The time-based function, in turn, is almost impractical to calculate from one lot to the next. As a result the wet process becomes a guessing game, and an art rather than a science.

More recently it has been demonstrated that the use of plasma technology can be applied to removing smear instead of wet-acid process. The plasma desmearing results in better uniformity throughout the matrix of the board, and from board to board within a lot. This is a distinct improvement because the control is more precise than that of the wet etchback process.

"Plasma" is defined as matter in an "elevated state". Physical properties of matter in the plasma state are somewhat similar to those in the gaseous state. The flow patterns and characteristics become extremely aggressive in the plasma state, where the gases are essentially in a nascent form. Plasma or these "active species" are created in a region between a pair of RF (radio frequency) electrodes, and are then directed toward the target surface. In this instance the example is directed to the holes in the MPWB's.

For desmearing with plasma of the MPWB's, various gases can be used depending upon the individual manufacturer's requirements and the type of laminate material. The gases more generally used are oxygen ($O_2$) and carbontetrafluoride ($CF_4$). When a mixture of these gases passes through the RF electrodes in a vacuum, the active species formed are said to be nascent oxygen and atomic fluorine. These active species react with the polymer/glass combination in the holes of the MPWB to form volatile products which are subsequently removed by exhausting.

The desmearing process using plasma basically requires a chamber, a vacuum pump, a source of RF energy, and metered gases. The chamber must withstand the vacuum, but more importantly, it must accommodate MPWB's so that the proper directional flow of the active species is possible, and so that there is an even flow of these species throughout the maxtrix of boards to achieve uniform results. This may be accomplished by placing the boards closest to the gas source and exhaust port a certain distance away. The distance is termed as a transition area. Once the chamber is designed, the vacuum pump must be selected with the proper throughput capability and compatibility with the gases used. The requirements for the source of RF energy depend upon the electrode surface area and power density requirements (Watts per square inch, not just Watts).

Several manufacturers are offering plasma desmearing systems which include a cylindrical chamber with a front loading door and either a barrel or planar electrode configuration. The MPWB's are processed either vertically or horizontally. The gas inlet is located on the top barrel wall, usually toward the front of the chamber. The exhaust valves are usually near the back wall. With this configuration, plasma is generated within the body (which acts as ground) and the electrodes. With a barrel electrode, the intensity of the field varies as it approaches the center of the chamber. Planar electrodes provide better distribution of the field, so long as they are paired (power and ground), since the gases within the plasma state reduce to ash the undesirable substrate material.

The flow characteristics of the gases are a function of the gas inlet at a relatively higher pressure to the exhaust outlet at a low pressure. A uniformity of field, and properly distributed gas flow are essential criteria to obtain uniform results in desmearing.

SUMMARY

The present invention is directed to employing a rectilinear chamber for desmearing in which the two transitional ends are frustopyramidal in configuration. Each frustopyramidal diffusion chamber has a controlled exhaust valve which is piped to the vacuum pump. Gas can be introduced to the diffusion chamber at a point adjacent the exhaust valve and centrally therefrom. Ideally there are an odd number of electrode pairs spaced vertically which generate a primary field, and further spaced apart pairs generating a secondary field therebetween. Because the chamber is rectilinear, it can be proportioned to accommodate vertically spaced MPWB's in the secondary chamber portions.

The method contemplates flowing plasma through a rectangular chamber by positioning the pairs of electrodes in closely spaced relationship to provide a primary field, one of the electrodes of each pair secured to a radio frequency source and the other to ground and then spacing the pairs a sufficient distance to permit the insertion of objects to be desmeared in the secondary field. The flow of plasma is directed to impact the objects and can be from left to right, then right to left thereby reversing the flow, pulsating or steady. In addition, in certain applications where plasma flow from one end to the other is not desired, the gas can be introduced centrally. The central introduction is also desirably employed for purging the rectilinear chamber.

In view of the foregoing, it is a primary object of the present invention to provide a method and apparatus for desmearing which is of significant importance in desmearing the drilled holes in MPWB's.

Yet another object of the present invention is to provide for plasma desmearing of MPWB's in a controlled process with a high level of precise repeatability and at cyclic rates substantially reducing the overal cost of desmearing.

Still another object of the present invention is to provide a method and apparatus for spacing MPWB's within a chamber for desmearing which results in a uniform treatment of the holes within the MPWB's irrespective of whether they are central of the unit or at the ends.

Yet another object of the present invention is to provide means for mixing or blending various gases for desmearing thereby readily accommodating various types of boards for desmearing.

ILLUSTRATIVE DRAWINGS

Further objects and advantages of the present invention will become apparent as the following description of an illustrative embodiment proceeds, taken in conjunction with the accompanying drawings, in which.

DESCRIPTION OF ILLUSTRATIVE APPARATUS

Figure 1:
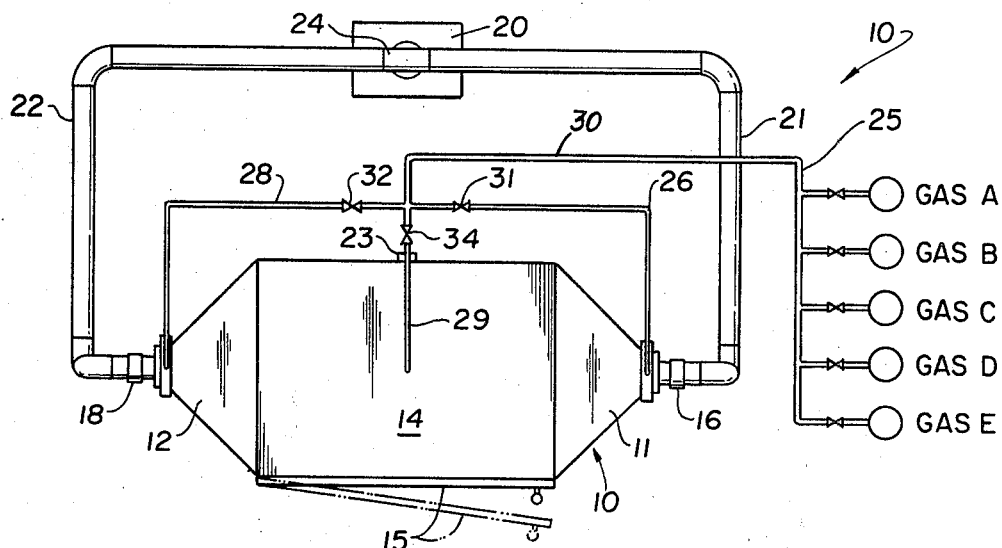
FIG. 1 is a top view of the desmearing system showing the door partially open in phantom lines and diagrammatically showing the gas manifold at the right end portion thereof.
Figure 3:
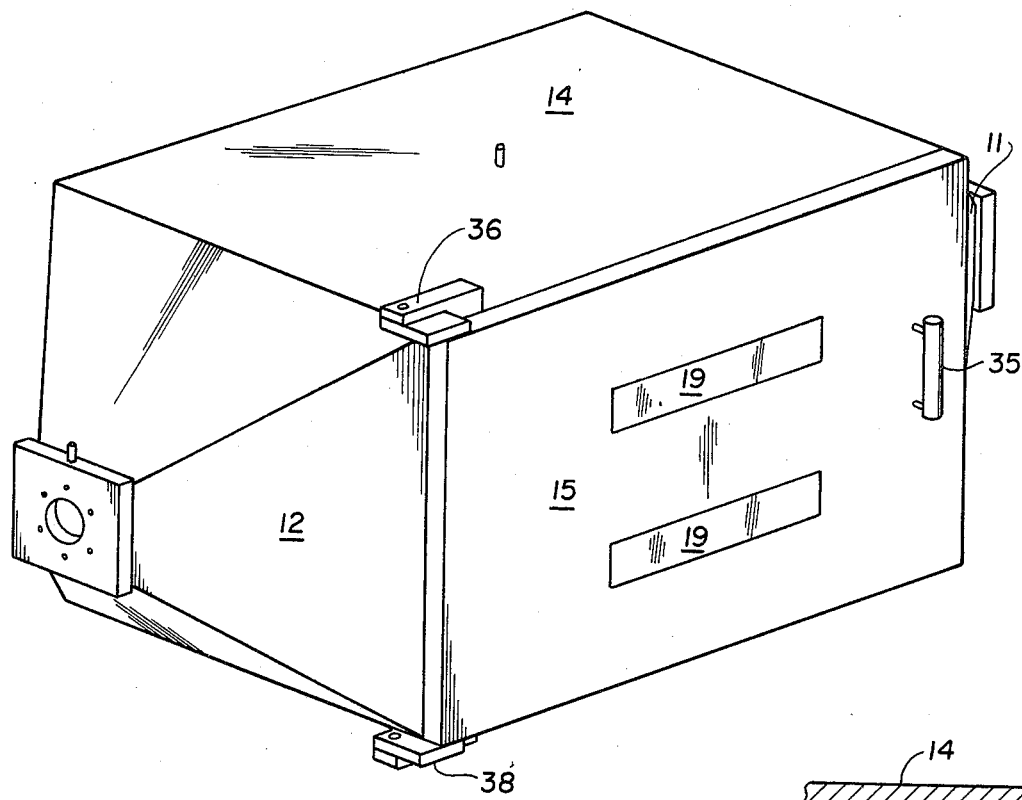
FIG. 3 is an isometric view of the chamber portion of the plasma desmearing apparatus showing the left end frustopyramidal diffusion stage and exhaust plate.

The general system for desmearing is shown in the top-plan view, partially diagrammatic, in FIG. 1. There it will be seen that the chamber 10 is centrally disposed, having a right frustopyramidal gas diffusion chamber 11 and a left frustopyramidal gas diffusion member 12. "Frustopyramidal" includes any shape tapering from rectangular to an exhaust connection. The cubical portion 14 has a rectangular cross-section, and terminates in the two diffusion pyramids 11, 12. When the chamber is referred to as "cubical" it is not meant to mean that it is equilateral, but rather rectangular in cross-section whether the section is taken longitudinally or laterally. Ideally, the cross-section is developed to accommodate the particular target, in this instance rectangular MPWB's. The front portion of the cube portion 14 has a door 15 as shown diagrammatically in the partially opened position. A right exhaust valve 16 and left exhaust valve 18 are provided at the ends of the frustopyramidal transition chambers 11, 12. Typically a three inch angle valve manufactured by Vacoa is employed which is air activated at 80 psi, solenoid controlled, and can be remotely programmed for either an on or an off condition, there being no throttling with the subject valves 16, 18. The door 15 is provided with windows 19 (see FIG. 3) for observing the operation of the unit and uniformity of plasma flow as will be discussed hereinafter.

A vacuum pump 20 is connected to the right exhaust pipe 21 and left exhaust pipe 22 by means of the exhaust Tee 24. Ideally suited for this operation is the Stokes Pennwalt vacuum pump model 212 MBX with halocarbon oil for oxygen service. Such a pump exhausts to approximately 3 microns, and has a 275 cubic foot per minute capacity. An air valve 23 is provided in the rear center of the cube portion 14 to normalize the chamber 10 at the end of the cycle. The air valve 23 has a ⅜" bore and is solenoid activated.

As noted further in FIG. 1, a gas manifold 25 connects a plurality of gas bottles identified as gases A-E inclusive and a right gas inlet 26 and left gas inlet 28 connect to the ends of the transition chambers, 11, 12 inboard of the exhaust valves 16, 18. In addition, a center gas inlet 29 is provided, shown here connected to the upper central portion of the chamber 10. A single gas line 30 connects the manifold 25 to the left, right and center inlets. Each of the right, left and center inlets has their respective control valves 31, 32, 34. The control valves for each of the inlets are "on-off" type valves. The gases are blended at the manifold 25 by means of manually adjusted flow regulators at each of the gases A-E, with a solenoid valve turning the gas on or off. As will be described hereinafter the gases ideally are oxygen, freon 14 (carbon-tetrafluoride); hydrogen fluoride in the dry gaseous state; nitrogen; and argon containing a portion of water vapor to serve to activate the hydrofluoric acid under certain conditions.

Figure 2:
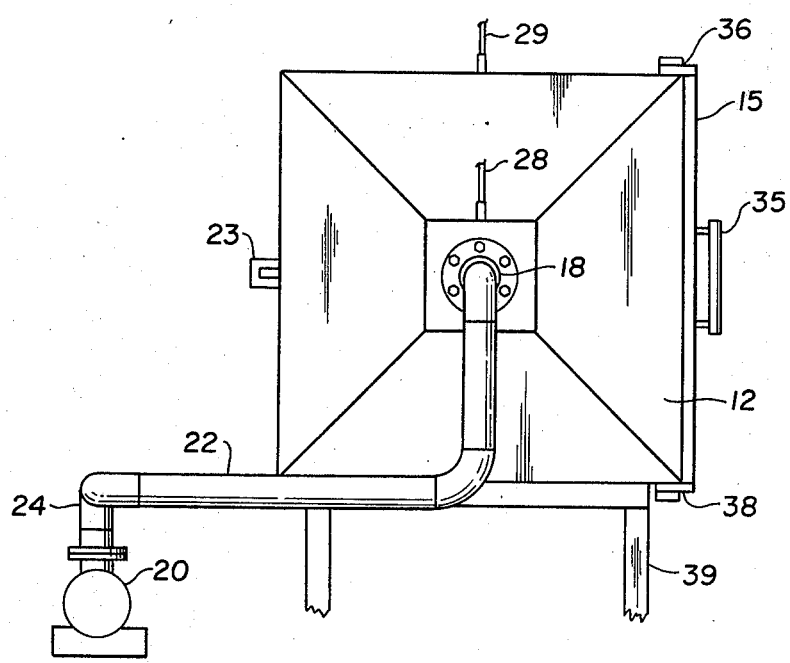
FIG. 2 is a left-end view of the plasma desmearing apparatus as shown in FIG. 1 with the underneath stand portion broken away.

As noted in FIG. 2, the door 15 is provided with a handle 35, the door being secured to the cube portion 14 by means of an upper hinge 36 and a lower hinge 38. The entire unit is supported on a stand 39, shown partially broken in FIG. 2.

Figure 5:
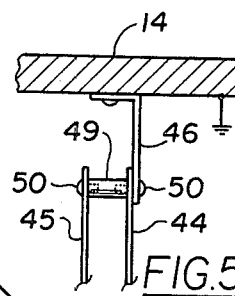
FIG. 5 is an enlarged view of the upper end of one of the pairs of electrodes showing how the same are spaced, and secured to the interior portion of the chamber.
Figure 4:
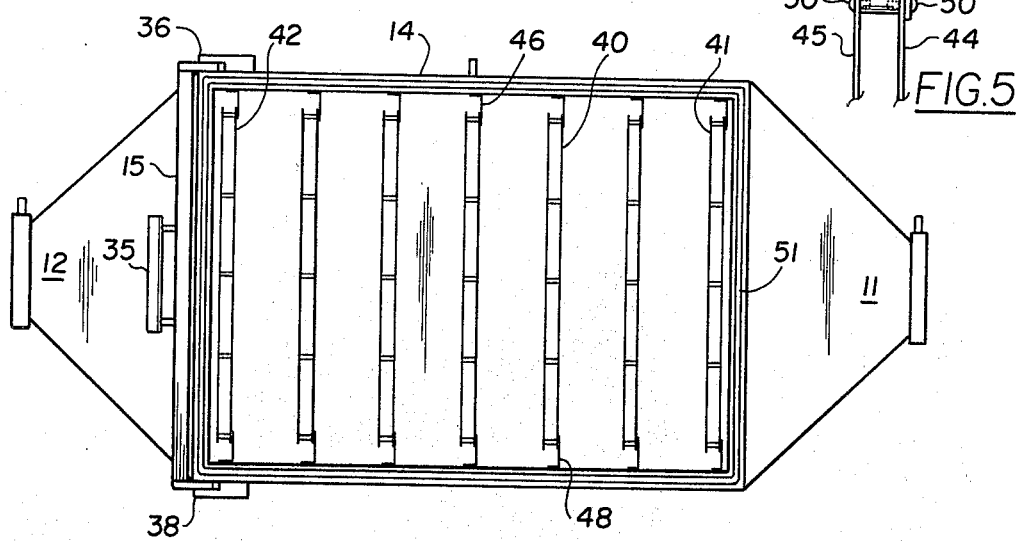
FIG. 4 is a front view of the plasma desmearing chamber showing the door open, and revealing the location of the pairs of electrodes interiorly of the chamber.

Turning now to FIG. 4, it will be seen that the electrodes 40 are in pairs. The pairs of electrodes 40 are normally inserted within the cubical 14 in an odd number, there being a right electrode end 41 and a left electrode end 42. More specifically the electrodes, as shown in FIG. 5, are approximately 24 by 24 inches formed from 5/32 inch thick aluminum, 58% open. The porosity is developed by staggered five-sixteeths inch holes. The one electrode plate 44 is grounded, and the other electrode charged plate 45 is spaced therefrom. Ground brackets 46, 48 secure the grounded plates 44 to the upper and lower portion of the cube portion 14. An insulated spacer 49 is provided between the two electrodes 44, 45 and the electrodes are then secured in spaced relationship as determined by the size of the insulated spacer 49 by means of the plate connectors 50. It is important that the door 15 be suitably sealed by means of the framing seal 51 as shown in FIG. 4. Normally this seal is coated with a silicone or other sealing compound.

Figure 7:
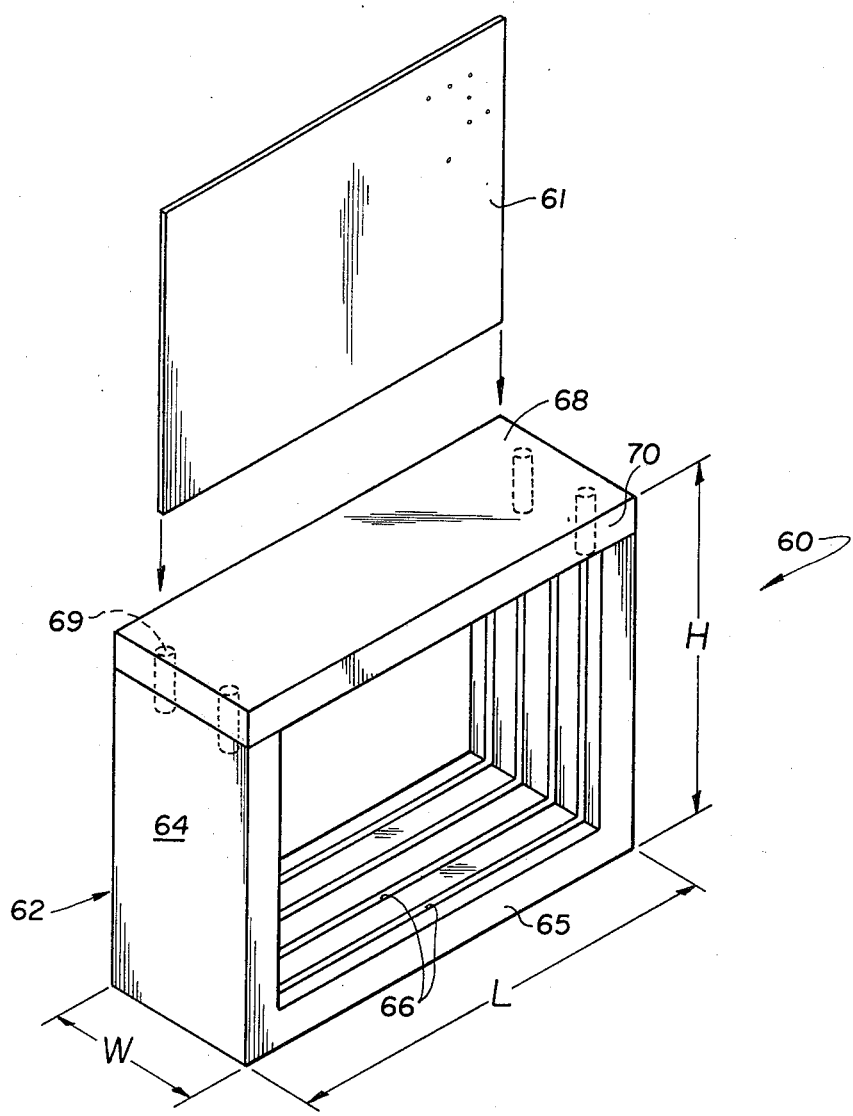
FIG. 7 is a perspective partially diagrammatic view of a typical MPWB and its related frame for securing the MPWB's within the chamber.

Turning now to FIG. 7, it will be seen that a typical MPWB frame 60 for use in the chamber 10 proportioned to fit within the secondary field is provided. The frame 60 comprises a U-shaped lower element made up of opposed ends 64, and a bottom 65. The ends 64 and bottom 65 are provided with slots 66. In addition a top 68 (also provided in its underneath portion with slots 66) is secured by means of mounting pins 69 to the two ends 64. When the top 68 is raised, four MPWB's 61 are inserted in the slots 66, and then the top 68 again secured on the MPWB 61. Desirably the length and height (L and H) of the frame 60 is proportioned to engage the bottom, sides, and top of the cube portion 14. The width W of the frame 60 is slightly less than the distance between adjacent pairs of electrodes 40. The exterior skirt 70 (formed on the end 64, bottom 65, and top 68) are of a sufficient dimension to mask the periphery of the MPWB 61 so that the plasma flow will not leak around the frame 60, but rather be directed through the holes in the MPWB 61.

The RF source, now shown, employs a generator manufactured by E.N.I. Power Systems of Rochester, New York. The unit is designated as Model EGR4800. This generates RF power to a maximum of 4,800 Watts. In normal usage 4,200 to 4,400 Watts are employed. A 50 ohm cable is provided between the generator and the charged plates 45. The frequency is between 8 kilohertz and 111 kilohertz, at the low side of the AM band. It is important that the entire system be grounded, essentially as shown in FIG. 5. This completes the RF application of power and of course developing a primary field between the spaced pairs of electrodes 44, 45, and a secondary field at the larger spaces in between the adjacent pairs. It is within the secondary field that the target to be desmeared is positioned.

THE METHOD

Figure 6:
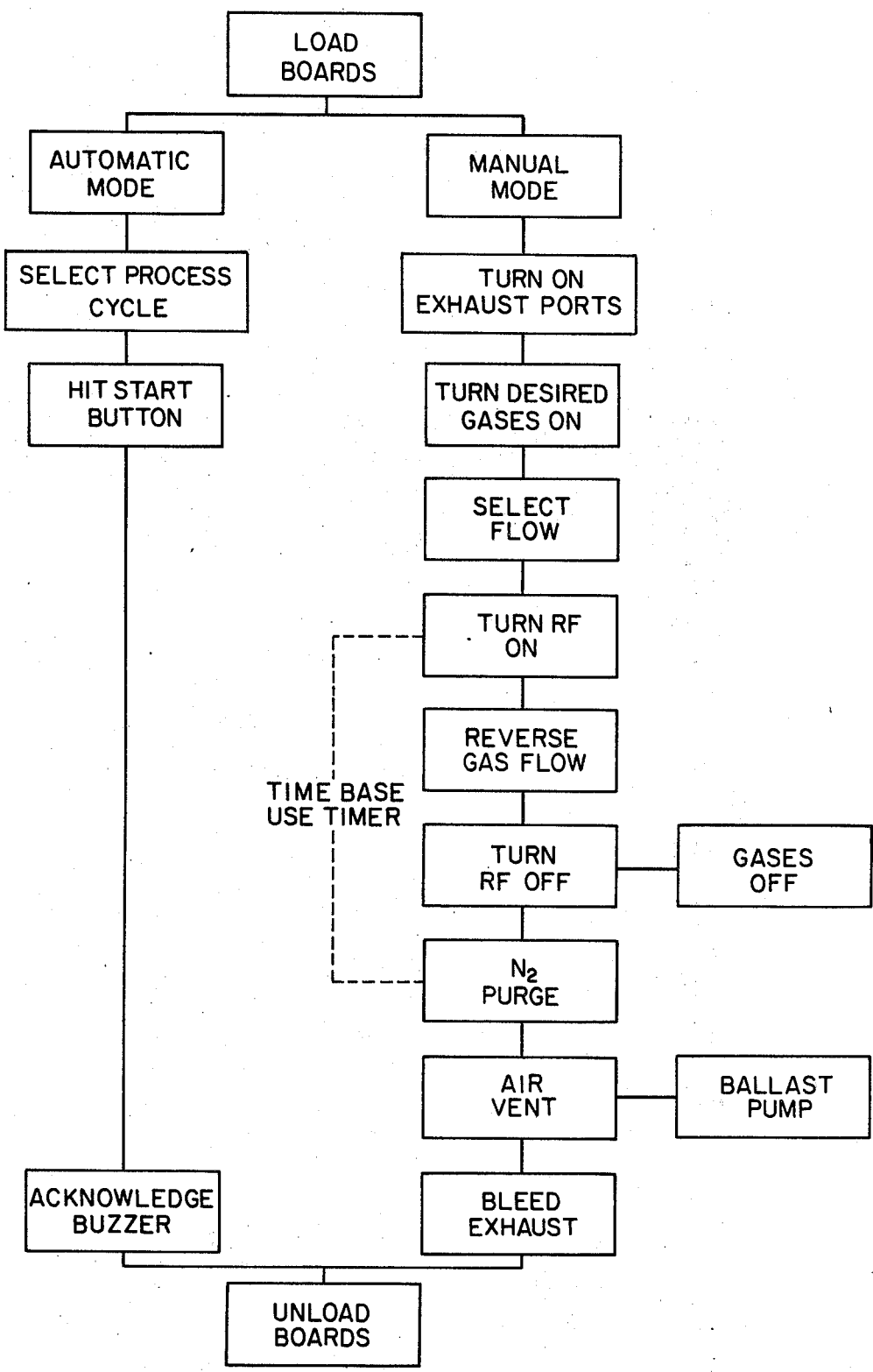
FIG. 6 is a labelled flow-sheet illustrating the steps of the method in sequence.

The method employed is essentially as shown step-by-step from top-to-bottom in FIG. 6. The first step is to load the target or printed circuit boards in the secondary fields between the adjacent pairs of electrodes 45, 46. With the manual mode, as shown in the right-hand side of FIG. 6, the door is closed and then the exhaust ports are opened. The vacuum pump is activated, and the desired gases are turned on. An ideal blend of gases results when the flow rate is adjusted to provide a mixture of 70% oxygen; 25% of freon 14 (carbontetrafluoride $CF_4$); and 5% hydrogen fluoride gas in the dry state (HF). In addition, nitrogen ($N_2$) may be provided for purging. Where an accelerator is desired for the hydrofluoric acid, argon with a mixture of water may be used. After the desired gases are selected, the flow is then determined by activating one or the other of the exhaust valves; and also determining in timed relationship therewith where the gas mixture is to be flowed. A timer then is activated to measure the cycle, and the RF generator is turned on. After a given period of time (as will be set forth in some examples) the gas flow may be reversed by reversing which inlet is employed to admit the gas and which exhaust valve is open to exhaust the same to the vacuum pump. Once the time cycle has been completed, the gases are turned off, and the RF generator is deactivated. A nitrogen purge is employed to clean out the cube portion 14, and then the air valve 23 activated to air vent the chamber 10. Thereafter the boards are unloaded.

On the automatic computer control cycle, the steps just recited above are programmed, and after the boards are loaded, the process cycle is selected, the start button activated, and the entire cycle proceeds timed automatically until an acknowledge buzzer activates, signalling the operator that it is time to unload the boards. The following examples relate to the desmearing of four printed circuit boards in each secondary chamber:

EXAMPLE 1

Load the unit. Both exhausts are turned on. The gas mixture is selected. The flow of gas from left to right is programmed by shutting off the left exhaust port and activating the left gas inlet valve. The RF frequency is then turned on. After 10 minutes the gas flow is reversed by activating the left exhaust port and right gas inlet, and shutting off the left gas inlet and right exhaust port. Five minutes later all valves are deactivated except both exhaust ports. Thereafter, nitrogen gas is bled in to purge the chamber for 1 minute. Both exhaust ports are then deactivated. The air valve is turned on to pressurize the chamber to atmosphere. Once the chamber is pressurized, the door is opened, and the boards are unloaded. The air valve is then closed.

EXAMPLE 2

Example two proceeds substantially in accordance with Example 1 above, except the gas inlets are activated to pulsate 2 seconds on, and 13 seconds off. The pulsating gas is more desirable where the holes in the MPWB's are smaller.

EXAMPLE 3

The MPWB's are loaded, and both exhaust valves activated. The gas mixture is selected to flow the gas right to left by shutting off the right exhaust port and activating the right gas inlet. The RF generator is then turned on. 15 Minutes later the gas flow is reversed as described in Example 1. 10 Minutes later the gas flow is reversed again for 10 minutes. The chamber is then purged within two after the RF power is deactivated, and then vented with air to pressurize the chamber to atmosphere.

EXAMPLE 4

Same as Example 3 except the gas inlets pulsate like in Example 2, 2 seconds on, and 13 seconds off.

EXAMPLE 5

Same as in any of the Examples 1–4 above, including the introduction of a small percentage of argon carrying water vapor to accelerate the activity of the hydrofluoric acid in desmearing.

EXAMPLE 6

Same as in any of the Examples 1–5 above, including changing the gas flow direction several times, whether straight flow or pulsating, but not less than 3 times during each process.

The method further contemplates the introduction of gas through the center inlet 29 with both exhaust valves 26, 18 open. When the center line 29 is active only, it will only be for a portion of the cycle since the diffusing characteristics of the frustopyramidal diffusion chambers 11, 12 are not effective when the center line feed alone is operating. On the other hand, the center line feed can be blended in when the gas flow is right to left or left to right, particularly when the flow is reversed, to introduce different flow currents.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

I claim:

1. The method of desmearing, comprising the steps of:
   providing a rectangular confinement for the flow of plasma gas excited by a radio frequency generator at very low pressure,
   positioning pairs of electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs,
   directing the flow of plasma to flow transverse to the electrodes through apertures contained within the electrodes and confined in the rectangular path to impact the objects to be desmeared,
   the entirety of all the above steps being performed within the rectangular confinement at very low pressure.

2. In the method of claim 1 above,
   further assisting the diffusion of the plasma by providing frustopyrimidal ingress and egress paths for the plasma into and out of said rectangular confined path.

3. In the method of claim 1 above,
   including providing means for introducing gases from the top of the rectangular confinement.

4. In the method of claim 1 above,
   including pulsing the flow of the plasma during the course of desmearing.

5. In the method of claim 1 above,
   including positioning a plurality of printed circuit boards vertically in said secondary field.

6. In the method of claim 5 above,
   further asisting the diffusion of the plasma by providing frustopyramidal ingress and egress paths for the plasma into and out of said rectangular confined path.

7. In the method of claim 5 above,
   including providing means for introducing plasma from the top of the rectangular confinement.

8. In the method of claim 5 above,
   including pulsing the flow of the plasma during the course of desmearing.

9. A method of desmearing, comprising the steps of:
   providing a rectangular confinement for the flow of plasma gas excited by a radio frequency generator at very low pressure;
   positioning pairs of electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs;
   directing the flow of plasma through the electrodes and confined in the rectangular path to impact the objects to be desmeared;
   reversing the flow of the plasma after desmearing has taken place in one direction for a finite period of time; and
   the entirety of all the above steps being performed within the rectangular confinement at very low pressure.

10. A method of desmearing, comprising the steps of:
    providing a rectangular confinement for the flow of plasma gas excited by a radio frequency generator at very low pressure;
    positioning pairs of electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs;

positioning a plurality of printed circuit boards vertically in said secondary field;

directing the flow of plasma to flow through the electrodes and confined in the rectangular path to impact the objects to be desmeared;

reversing the flow of the plasma after desmearing has taken place in one direction for a finite period of time, and the entirety of all the above steps being performed within the rectangular confinement at very low pressure.

11. In an apparatus for plasma desmearing comprising, in combination:

a chamber rectangular in cross-section;

door means for access to said chamber from one side thereof;

a diffusion chamber on each end of said chamber;

means connecting the ends of two diffusion chambers to a reduced pressure source;

means for introducing at least one gas into said rectangular chamber at the ends thereof when the same is substantially evacuated by the vacuum means;

a plurality of electrodes positioned, in close proximate relationship in pairs, transverse to the direction of the flow of the gas within said chamber, one electrode of each pair being connected to a radio frequency generating means and the other electrode of each pair being connected to ground, thereby defining a primary field between said closely spaced pairs;

adjacent pairs of electrodes defining spaces therebetween for forming a secondary field;

means for securing objects to be desmeared between the adjacent pairs of electrodes and in the secondary field;

the electrodes including sufficient openings to assist in diffusing the plasma gas while passing therethrough prior to and after impacting the objects to be desmeared; and control means for providing plasma flow through the rectangular chamber while the radio frequency generator is operating.

12. In the desmearing apparatus of claim 11, further including means for providing plasma flow gas into the top of the chamber at a mid position, and control means for the top gas flow means to permit admixing with gas flow from one end or the other end of the chamber or without such gas flow with the top gas flow means being the primary source of the gas flow.

13. In the desmearing apparatus of claim 11, further including means for inserting a plurality of printed circuit boards into the secondary field.

14. In the desmearing apparatus of claim 13, further including means for providing plasma flow gas into the top of the chamber at a mid position, and control means for the top gas flow means to permit admixing with gas flow from one end or the other end of the chamber or without such gas flow with the top gas flow means being the primary source of the gas flow.

15. The method of desmearing, comprising the steps of:

providing a chamber for the confinement for the flow of plasma gas excited by a radio frequency generator at very low pressure, positioning pairs of apertured electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs, directing the flow of the plasma to flow transverse to the electrode through apertures in the electrodes and confined in the chamber to impact the objects to be desmeared, the entirety of all the above steps being performed within the chamber at very low pressure.

16. In the method of claim 15 above, further assisting the diffusion of the plasma by providing a gas diffusion chamber for the ingress and egress of the plasma into and out of the chamber.

17. In the method of claim 15, above, including providing means for introducing gases from the top of the chamber confinement.

18. In the method of claim 15 above, including pulsing the flow of the plasma during the course of desmearing.

19. In the method of claim 15 above, including positioning a plurality of printed circuit boards vertically in said secondary field.

20. In the method of claim 19 above, further assisting the diffusion of the plasma by providing a diffusion chamber for the ingress and a diffusion chamber for the egress paths for the plasma into and out of the chamber for the confinement of printed circuit boards.

21. In the method of claim 19 above, including providing means for introducing plasma from the top of the rectangular confinement.

22. In the method of claim 19 above, including pulsing the flow of the plasma during the course of desmearing.

23. A method of desmearing, comprising the steps of:

providing a chamber for the confinement for the flow of plasma gas excited by a radio frequency generator at very low pressure, positioning pairs of electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs, directing the flow of the plasma through the electrodes and confined in the chamber to impact the objects to be desmeared, reversing the flow of the plasma after desmearing has taken place in one direction for a finite period of time, and the entirety of all the above steps being performed within the chamber at very low pressure.

24. A method of desmearing, comprising the steps of:

providing a chamber for the confinement for the flow of plasma gas excited by a radio frequency generator at very low pressure, positioning pairs of electrodes in close spaced relationship to provide a primary field between the electrodes of each pair, one electrode of each pair being connected to the radio frequency source and the other to ground and spacing the pairs of such electrodes a sufficient distance apart to permit the insertion of objects to be desmeared in the secondary field between the adjacent pairs, positioning a plurality of printed circuit boards vertically in said secondary field, directing the flow of the plasma through the electrodes and confined in the chamber to impact the objects to be desmeared, reversing the flow of the plasma after desmearing has taken place in one direction for a finite period of time, and the entirety of all the above steps being performed within the chamber at very low pressure.

25. An apparatus for plasma desmearing, comprising in combination:

a chamber for confining the path of plasma;

door means for access to said chamber from one side thereof;

a diffusion chamber on each end of said chamber;

means connecting the ends of the two diffusion chambers to a reduced pressure source;

means for introducing at least one gas into said chamber at the ends thereof when the same is substantially evacuated by the vacuum means;

a plurality of apertured electrodes positioned in close proximate relationship in pairs, transverse to the direction of the flow of the gas within said chamber, one electrode of each pair being connected to a radio frequency generating means and the other electrode of each pair being connected to ground, thereby defining a primary field between said closely spaced pairs;

adjacent pairs of electrodes defining spaces therebetween for forming a secondary field;

means for securing objects to be desmeared between the adjacent pairs of electrodes and in the secondary field;

and control means for providing plasma flow through the chamber while the radio frequency generator is operating.

26. In the desmearing apparatus of claim 25, further including means for providing plasma flow gas into the top of the chamber at a mid position, and control means for the top gas flow means to permit admixing with gas flow from one end or the other end of the chamber or without such gas flow with the top gas flow means being the primary source of the gas flow.

27. In the desmearing apparatus of claim 25, further including means for inserting a plurality of printed circuit boards into the secondary field.

28. In the desmearing apparatus of claim 27, further including means for providing plasma flow gas into the top of the chamber at a mid position, and control means for the top gas flow means to permit admixing with gas flow from one end or the other end of the chamber or without such gas flow with the top gas flow means being the primary source of the gas flow.

* * * * *